(12) United States Patent
Matsuda et al.

(10) Patent No.: US 8,206,999 B2
(45) Date of Patent: Jun. 26, 2012

(54) CHIP-TYPE LED AND METHOD FOR MANUFACTURING THE SAME

(75) Inventors: Makoto Matsuda, Mihara (JP); Toshio Hata, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 13/162,295

(22) Filed: Jun. 16, 2011

(65) Prior Publication Data

US 2011/0244606 A1 Oct. 6, 2011

Related U.S. Application Data

(62) Division of application No. 12/260,742, filed on Oct. 29, 2008, now Pat. No. 7,985,980.

(30) Foreign Application Priority Data

Oct. 31, 2007 (JP) .................................. 2007-284136
Dec. 25, 2007 (JP) .................................. 2007-332943

(51) Int. Cl.
   *H01L 33/00* (2010.01)
(52) U.S. Cl. .................................. 438/26; 257/E33.059
(58) Field of Classification Search ........................ None
See application file for complete search history.

(56) References Cited

U.S. PATENT DOCUMENTS

| | | | |
|---|---|---|---|
| 5,748,658 A * | 5/1998 | Nakanishi et al. | ......... 372/43.01 |
| 7,429,757 B2 | 9/2008 | Oyama et al. | |
| 2005/0280017 A1 | 12/2005 | Oshio et al. | |
| 2006/0102917 A1 | 5/2006 | Oyama et al. | |

FOREIGN PATENT DOCUMENTS

| | | |
|---|---|---|
| JP | 7-235696 | 9/1995 |
| JP | 2001-160629 | 6/2001 |
| JP | 2006-190764 | 7/2006 |
| JP | 2006-229055 | 8/2006 |
| JP | 2007-150233 | 6/2007 |
| JP | 2007-165502 | 6/2007 |
| WO | WO-2004/001862 | 12/2003 |

OTHER PUBLICATIONS

Matsuda, et al., U.S. Office Action mailed Sep. 30, 2010, directed to U.S. Appl. No. 12/260,742; 7 pages.

* cited by examiner

*Primary Examiner* — Ha Tran T Nguyen
*Assistant Examiner* — Kevin Quinto
(74) *Attorney, Agent, or Firm* — Morrison & Foerster LLP

(57) ABSTRACT

In a chip-type LED according to an embodiment of the present invention, a first recess hole for mounting an LED chip and a second recess hole for connecting a fine metal wire are formed in an insulating substrate, a metal sheet serving as a first wiring pattern is formed at a portion that includes the first recess hole, a metal sheet serving as a second wiring pattern is formed at a portion that includes the second recess hole, an LED chip is mounted on the metal sheet within the first recess hole, the LED chip is electrically connected to the metal sheet within the second recess hole via a fine metal wire, the LED chip including the first recess hole and the fine metal wire including the second recess hole are encapsulated in a first transparent resin that contains a fluorescent material, a surface of the insulating substrate including the first transparent resin is encapsulated in a second transparent resin.

6 Claims, 9 Drawing Sheets

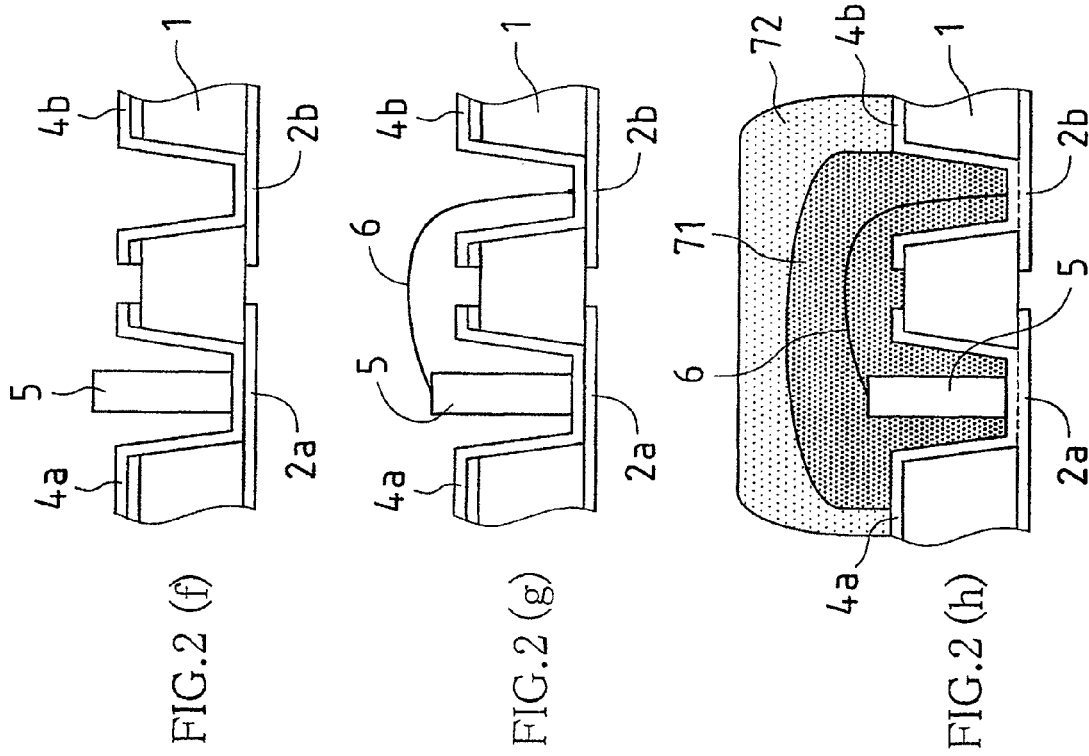
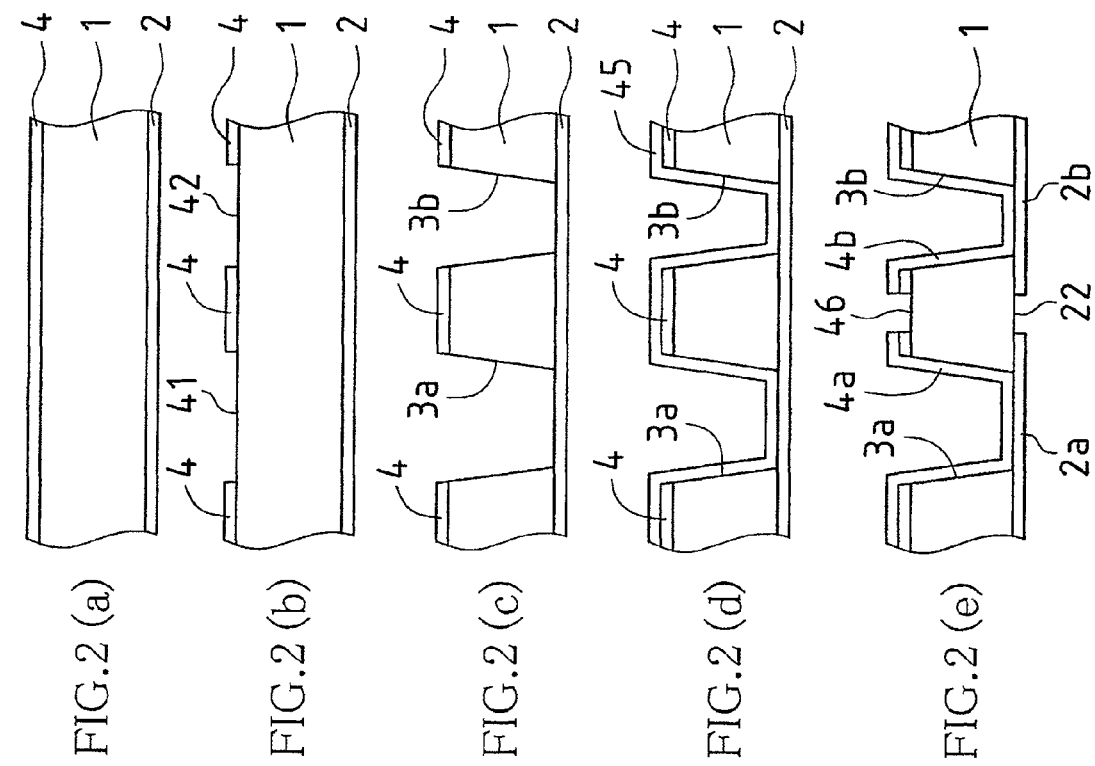

CHIP-TYPE LED AND METHOD FOR MANUFACTURING THE SAME

This application is a divisional application of U.S. patent application Ser. No. 12/260,742, filed Oct. 29, 2008, now allowed, which claims priority under 35 U.S.C. §119(a) on Japanese Patent Application No. 2007-284136 filed in Japan on Oct. 31, 2007 and Japanese Patent Application No. 2007-332943 filed in Japan on Dec. 25, 2007, the entire contents of which are herein incorporated by reference.

BACKGROUND OF THE INVENTION

The present invention relates to a surface-mounted chip-type LED and a method for manufacturing the same, and is used as a light source in various types of display panels, backlighting for liquid-crystal display apparatuses, lighting switches, and the like.

Chip-type LEDs have conventionally been used as a light source in various types of display panels, backlighting for liquid-crystal display apparatuses, lighting switches, and the like.

FIG. 12 shows an example of the structure of a conventional chip-type LED.

The conventional chip-type LED has a two-layer structure including insulating substrates 81 and 82, and is configured such that a through hole 83 is formed in the upper insulating substrate 82, a wiring pattern 84 is formed such that it extends to the bottom within the through hole 83 (i.e., the upper surface of the lower insulating substrate 81), an LED chip 85 is mounted on the wiring pattern 84 within the through hole 83, the LED chip 85 is connected to another wiring pattern 86 with a fine metal wire (Au wire, etc.) 87, and the surface of the insulating substrate 82 is encapsulated in a transparent resin 88 so as to include the LED chip 85 and the fine metal wire 87. Chip-type LEDs having a structure as described above are disclosed in, for example, JP 2001-160629A and JP 2006-190764A.

However, a chip-type LED of the conventional structure requires two insulating substrates 81 and 82, and the lower insulating substrate 82 is required to have a minimum thickness necessary to carry the LED chip 85 because the LED chip 85 is mounted on the lower insulating substrate 82, and thus problems exist such as difficulties achieving a thin LED and high costs.

In order to solve this problem, JP H07-235696A discloses a wiring structure for a semiconductor device and a method for forming the same. According to JP H07-235696A, a semiconductor device is obtained by forming a through hole on the surface side of an overall thin copper-laminated substrate obtained by laminating thin copper plates on the surface and undersurface of an insulating resin substrate, mounting an LED chip on an exposed surface of the lower copper plate inside the thorough hole, and performing encapsulation with a single resin layer so as to cover the through hole.

JP H07-235696A that discloses this thin semiconductor device doesn't reveal a technique for letting the semiconductor device to emit white light. In order to cause the semiconductor device to emit white light, it is only necessary to include a yellow fluorescent material in the single resin layer. To form the encapsulating resin, there is a method in which a fluorescent material is included in a semi-cured tablet resin (a resin for transfer molding) and transfer molding is performed to obtain a white light-emitting chip LED. This method provides very good workability and thus is suitable for mass production.

However, due to the nature of transfer molding, the concentration of the fluorescent material varies significantly from place to place, and it is impossible to avoid variations in chromaticity, which is a very important property of white light-emitting LEDs.

In addition, there is a limitation on the production method of such a table resin (the quantity produced at one time is very large), so the blending ratio of the fluorescent material cannot be flexibly changed.

Moreover, it is generally known that the light emitting efficiency can be increased to a maximum by disposing the fluorescent material near the LED chip. When transfer molding is performed, however, the fluorescent material spreads not only near the LED chip but also throughout the entire molding resin, making the light emitting efficiency low relative to the amount of the fluorescent material used. Also, color nonuniformity is likely to occur due to sedimentation of the fluorescent material and the like.

Silicone resins having a high heat resistance are commonly used as an encapsulating resin material, but it is impossible to perform transfer molding with a silicone resin because transfer molding employs a resin that can be in a semi-cured state. It is possible to perform transfer molding with a resin that is liquid in an uncured state such as silicone resin, but a highly sophisticated technique is required because air bubbles are easily included in a low viscous liquid resin and a dedicated apparatus is necessary that includes a means for preventing the inclusion of air bubbles.

Furthermore, silicone resins have a rigidity lower than that of epoxy resins, and in a chip-type LED structure in which a member for protecting the encapsulating resin, such as a reflective material, is not provided around the encapsulating resin, the encapsulating resin is easily scratched and deformed (e.g., due to direct contact of the upper surface with a mounting device). For this reason, silicone resins are not suitable for use as an encapsulating resin.

Nonetheless, the resin near the chip is degraded significantly by light (ultraviolet, near-ultraviolet to blue light) emitted from the chip before conversion by the fluorescent material. Accordingly, a silicone resin, which has better light resistance than an epoxy resin, should be used to encapsulate the periphery of the chip.

SUMMARY OF THE INVENTION

The present invention has been conceived to solve the aforementioned problems, and it is an object of the present invention to provide a thin chip-type LED, in which an LED chip is mounted within a through hole formed in a substrate, that can suppress sedimentation and uneven distribution of the fluorescent material and emit white light or visible light with less color nonuniformity, and a method for manufacturing such a chip-type LED.

In order to solve the above problems, the present invention relates to a chip-type LED, wherein a first recess hole for mounting an LED chip and a second recess hole for connecting a fine metal wire are formed in an insulating substrate, a metal sheet serving as a first wiring pattern is formed at a portion that includes the first recess hole, a metal sheet serving as a second wiring pattern is formed at a portion that includes the second recess hole, an LED chip is mounted on the metal sheet within the first recess hole, the LED chip is electrically connected to the metal sheet within the second recess hole via a fine metal wire, the LED chip including the first recess hole and the fine metal wire including the second recess hole are encapsulated in a first transparent resin that contains a fluorescent material, a surface of the insulating substrate including the first transparent resin is encapsulated in a second transparent resin. In accordance with this configuration, an encapsulation with the first transparent resin may be performed by a process different from that with the second transparent resin.

Another aspect of the present invention relates to a chip-type LED, wherein a first recess hole for mounting an LED chip and a second recess hole for connecting a fine metal wire are formed in an insulating substrate, a metal sheet serving as a first wiring pattern is formed at a portion that includes the first recess hole, a metal sheet serving as a second wiring pattern is formed at a portion that includes the second recess hole, an LED chip is mounted on the metal sheet within the first recess hole, the LED chip is electrically connected to the metal sheet within the second recess hole via a fine metal wire, the LED chip including the first recess hole and part of the fine metal wire are encapsulated in a first transparent resin that contains a fluorescent material, the second recess hole and another part of the fine metal wire are encapsulated in a third transparent resin, a surface of the insulating substrate including the first transparent resin and the third transparent resin is encapsulated in a second transparent resin. In accordance with this configuration, an encapsulation with the first and third transparent resins may be performed by a process different from that with the second transparent resin.

With this configuration, the area on which the LED chip is mounted and the area to which an end of the fine metal wire, the other end of which is connected to the LED chip, is connected are formed on the metal sheets, whereby it is possible to lower the height of the fine metal wire. Furthermore, because the LED chip is mounted directly on the metal sheet (first wiring pattern), it is unnecessary to use a conventional substrate and possible to reduce the thickness. Accordingly, the height of the fine metal wire can be made lower than that of conventional technology, making the chip-type LED even thinner.

In the present invention, the first wiring pattern on which the LED chip is mounted and the second wiring pattern to which an end of the fine metal wire is connected can be electrically insulated easily by removing the metal sheet. Furthermore, because the wiring pattern formed within the recess holes is electrically connected directly to the metal sheet at the bottom, it is unnecessary to form a wiring pattern and the like in the outer periphery of the insulating substrate, which makes the manufacturing method easier than the method for manufacturing a conventional chip-type LED. Accordingly, the manufacturing cost can be reduced as well.

In this case, the bottom of the first recess hole on which the LED chip is mounted and the bottom of the second recess hole to which the fine metal wire extending from the LED chip is electrically connected are formed to have a substantially equal height. This eliminates the need to adjust the laser output when processing, etc., making the recess hole forming process easy.

In the present invention, the second recess hole to which the fine metal wire extending from the LED chip is electrically connected may be formed at least two locations. By forming the second recess hole at least two locations, even when the LED chip has an electrode structure in which anode and cathode electrodes are formed on the surface side, and more complicated wiring is employed that uses fine metal wires instead of drawing out the electrodes of the LED chip from the mounting surface of the LED chip, the chip-type LED can be made thinner.

The chip-type LED of the present invention may have a structure in which a groove in which the fine metal wire is provided is formed on the surface of a wall member provided between the first recess hole and the second recess hole. By forming the groove as described and providing the fine metal wire such that the fine metal wire passes through the groove, the height at which the fine metal wire is disposed can be lowered even more, making the chip-type LED even thinner.

In the present invention, a fluorescent material may be contained in the transparent resin. Furthermore, it is preferable that the inner surfaces of the recess holes are formed to have inclined surfaces that flare gradually from the undersurface toward the surface of the insulating substrate. With this configuration, when the chip-type LED of the present invention is used as a light source in various types of display panels, backlighting for liquid-crystal display apparatuses, lighting switches and the like, the light that travels toward the side faces when the chip-type LED lights up is reflected by the inclined surfaces and travels upward, and therefore the reflective efficiency in the upward direction can be improved.

It is preferable that the first transparent resin is a silicone-based resin, and the second transparent resin is an epoxy-based resin. By using a silicone-based resin as the first transparent resin, the thermal stress is reduced, and the occurrence of a disconnection defect between the LED chip and the fine metal wire as well as between the metal surface of the second recess hole for connecting a fine metal wire and the fine metal wire is reduced. It is preferable that the first transparent resin that has been formed to cover the LED chip, the fine metal wire and the second recess hole serving as a fine metal wire connecting portion is covered with an epoxy-based resin as the second transparent resin. The epoxy-based resin is superior in viscosity, transparency, weather resistance and strength, and is suitable as an encapsulating resin.

Furthermore, by forming the third transparent resin using a silicone-based resin, the occurrence of a disconnection defect of the connecting portion of the fine metal wire can be reduced because silicone-based resins have a small thermal expansion coefficient. Moreover, because different encapsulating resins can be used for the first recess hole for mounting an LED chip, the second recess hole for connecting a fine metal wire and other regions of the insulating substrate surface, it is possible to form a package structure that can provide a great freedom in selection of resins.

The present invention further relates to a method for manufacturing a chip-type LED including: a step of forming metal sheets on the surface and the undersurface of an insulating substrate; a step of removing the metal sheet on the surface side of the insulating substrate at an LED chip mounting position and a fine metal wire connecting position; a step of forming a first recess hole and a second recess hole in the regions from which the metal sheet has been removed such that the first and second recess holes have a depth extending to the metal sheet on the undersurface side of the insulating substrate; a step of forming a conductive layer such that a conductive layer extends over the side faces of the recess holes and the metal sheet at the bottom of the recess holes; a step of forming an Au-containing layer on the surface of the conductive layer by vapor deposition; a step of forming an insulating region; a step of mounting an LED chip on the bottom of the first recess hole; a step of electrically connecting the LED chip and the bottom of the second recess hole using a fine metal wire; a first encapsulating step of encapsulating the first recess hole and part of the fine metal wire in a first transparent resin by a potting process so as to cover the LED chip; and a second encapsulating step of encapsulating the first transparent resin in a second transparent resin by a transfer molding process so as to cover the first transparent resin.

That is, according to the manufacturing method of the present invention, it is unnecessary to form a wiring pattern and the like in the outer periphery of the insulating substrate, which makes the manufacturing method easy and can reduce the manufacturing cost. When the first and second recess holes are formed by irradiating laser light to an LED chip mounting portion of the insulating substrate and removing the target area of the insulating substrate with the laser light such that the first and second recess holes reach the metal sheet of the undersurface, for example, because the laser light removes the insulating portion outwardly from the center portion, the inner surfaces of the first and second recess holes can be formed to have inclined surfaces (curved surfaces). In other words, by only irradiating laser light, the formation of the first and second recess holes and the formation of the inclined inner surfaces can be performed at the same time.

Furthermore, according to the manufacturing method of the present invention, the second encapsulating step may involve encapsulating the second recess hole and part of the fine metal wire. It is also possible to configure such that the manufacturing method of the present invention further involves a third encapsulating step of encapsulating the second recess hole and part of the fine metal wire in a third transparent resin so as to cover the second recess hole, and in the second encapsulating step, the first transparent resin and the third transparent resin are covered with the second transparent resin. It is also possible to configure such that, in the second encapsulating step, the surface of the insulating substrate is covered with the second transparent resin. By covering the surface of the insulating substrate with the second transparent resin as described above, the conductive layer formed on the substrate surface can be protected. It is also possible to configure such that, in the second encapsulating step, the second recess hole is not covered with the second transparent resin.

It is preferable that the first transparent resin is formed by a potting process, and the second transparent resin is formed by a transfer molding process. That is, because it is difficult for the fluorescent material to spread uniformly in the first recess hole in which the LED chip has been mounted, it is preferable to form the first transparent resin by a potting process. Also, by forming the second transparent resin using a transfer molding process which allows en bloc encapsulation, a reduction in the production cost can be achieved and packages with uniform properties can be obtained.

BRIEF DESCRIPTION OF THE DRAWINGS

FIG. 2(*a*) is a diagram illustrating a method for manufacturing the chip-type LED according to Embodiment 1 of the present invention.

FIG. 2(*b*) is a diagram illustrating the method for manufacturing the chip-type LED according to Embodiment 1 of the present invention.

FIG. 2(*c*) is a diagram illustrating the method for manufacturing the chip-type LED according to Embodiment 1 of the present invention.

FIG. 2(*d*) is a diagram illustrating the method for manufacturing the chip-type LED according to Embodiment 1 of the present invention.

FIG. 2(*e*) is a diagram illustrating the method for manufacturing the chip-type LED according to Embodiment 1 of the present invention.

FIG. 2(*f*) is a diagram illustrating the method for manufacturing the chip-type LED according to Embodiment 1 of the present invention.

FIG. 2(*g*) is a diagram illustrating the method for manufacturing the chip-type LED according to Embodiment 1 of the present invention.

FIG. 2(*h*) is a diagram illustrating the method for manufacturing the chip-type LED according to Embodiment 1 of the present invention.

FIG. 7(*b*) is a diagram illustrating the method for manufacturing the chip-type LED according to Embodiment 2 of the present invention.

FIG. 7(*c*) is a diagram illustrating the method for manufacturing the chip-type LED according to Embodiment 2 of the present invention.

FIG. 7(*d*) is a diagram illustrating the method for manufacturing the chip-type LED according to Embodiment 2 of the present invention.

FIG. 7(*e*) is a diagram illustrating the method for manufacturing the chip-type LED according to Embodiment 2 of the present invention.

FIG. 7(*f*) is a diagram illustrating the method for manufacturing the chip-type LED according to Embodiment 2 of the present invention.

FIG. 7(*g*) is a diagram illustrating the method for manufacturing the chip-type LED according to Embodiment 2 of the present invention.

FIG. 7(*h*) is a diagram illustrating the method for manufacturing the chip-type LED according to Embodiment 2 of the present invention.

FIG. 10(*b*) is a diagram illustrating the method for manufacturing the chip-type LED according to Embodiment 3 of the present invention.

FIG. 10(*c*) is a diagram illustrating the method for manufacturing the chip-type LED according to Embodiment 3 of the present invention.

FIG. 10(*d*) is a diagram illustrating the method for manufacturing the chip-type LED according to Embodiment 3 of the present invention.

FIG. 10(*e*) is a diagram illustrating the method for manufacturing the chip-type LED according to Embodiment 3 of the present invention.

FIG. 10(*f*) is a diagram illustrating the method for manufacturing the chip-type LED according to Embodiment 3 of the present invention.

FIG. 10(*g*) is a diagram illustrating the method for manufacturing the chip-type LED according to Embodiment 3 of the present invention.

FIG. 10(h) is a diagram illustrating the method for manufacturing the chip-type LED according to Embodiment 3 of the present invention.

DESCRIPTION OF THE PREFERRED EMBODIMENTS

Hereinafter, embodiments of the present invention will be described with reference to the accompanying drawings.

<Embodiment 1>

Figure 1:
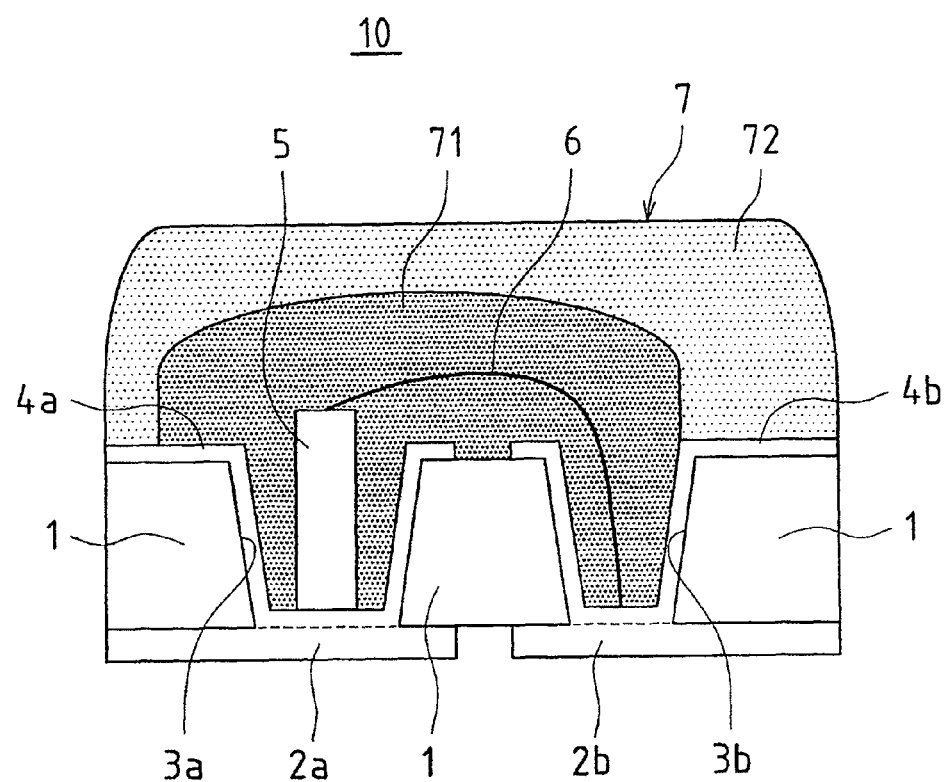
FIG. 1 is a cross-sectional view of a chip-type LED according to Embodiment 1 of the present invention.

FIG. 1 is a cross-sectional view of a chip-type LED 10 according to Embodiment 1 of the present invention.

In the chip-type LED 10, a first recess hole (through hole) 3a for mounting an LED chip and a second recess hole (through hole) 3b for connecting a fine metal wire are formed in an insulating substrate 1. Metal (Cu) sheets 2a and 2b serving as the wiring patterns for the recess holes are formed on the undersurface side of the insulating substrate 1 in an electrically insulated state. On the surface side of the insulating substrate 1, a metal sheet 4a serving as a first wiring pattern is formed in a portion that includes the first recess hole 3a, and a metal sheet 4b serving as a second wiring pattern is formed in a portion that includes the second recess hole 3b. In this wiring structure, an LED chip 5 is mounted on the metal sheet 4a at the bottom portion of the first recess hole 3a, and the LED chip 5 is electrically connected to the metal sheet 4b at the bottom portion of the second recess hole 3b via a fine metal wire 6. In this state, the entire surface of the insulating substrate 1, including the LED chip 5 and the fine metal wire 6, is encapsulated in a transparent resin 7.

In Embodiment 1, the transparent resin 7 is formed of a first transparent resin 71 for encapsulating the LED chip 5 including the first recess hole 3a and the entire fine metal wire 6 including the second recess hole 3b; and a second transparent resin 72 for encapsulating the entire surface of the insulating substrate 1 including the first transparent resin 71. Although the details will be given later when describing a method of manufacture thereof, the first transparent resin 71 contains a yellow fluorescent material (e.g., α-SIALON, etc.) and is formed by potting. The second transparent resin 72 is made of only a transparent resin and is formed by transfer molding. The reason for adopting such configuration and manufacturing method is to avoid uneven distribution of the fluorescent material, which is a disadvantage of transfer molding. The layer that contains a fluorescent material is formed by potting, and the outer shape of the transparent resin 7, which affects extraction of light, that is, the outer shape of the second transparent resin is formed by transfer molding in which molding can be performed stably.

In Embodiment 1, the first transparent resin 71 is made of a silicone-based resin, and the second transparent resin 72 is made of an epoxy-based resin. The insulating substrate 1 is formed of a glass epoxy resin and has a thickness of approximately 50 μm. The metal (Cu) sheets 2a and 2b formed on the undersurface side are formed to have a thickness of approximately 20 μm. Furthermore, in the present embodiment, the first recess hole 3a for mounting an LED chip is formed to have an inner diameter ϕ of 470 μm, and the second recess hole 3b for connecting a fine metal wire is formed to have an inner diameter ϕ of 180 μm.

As described above, according to Embodiment 1, because the area on which the LED chip 5 is mounted and the area to which an end of the fine metal wire 6, the other end of which is connected to the LED chip 5, is connected are formed on the metal sheets 2a and 2b, the height of the fine metal wire 6 can be lowered. In addition, because the LED chip 5 is mounted directly on the metal sheets 4a and 2a, it is unnecessary to use a conventional substrate, so the thickness can be reduced and the height of the fine metal wire 6 can be made lower than that of conventional technology, making the chip-type LED even thinner.

A method for manufacturing the chip-type LED 10 thus configured will be described with reference to FIGS. 2(a) to 2(h).

In the first step, metal sheets 2 and 4 are formed on the surface and undersurface of an insulating substrate 1, respectively (FIG. 2(a)).

In the next step, the metal sheet 4 is removed at an LED chip mounting position 41 and a fine metal wire connecting position 42 on the surface side of the insulating substrate 1 (FIG. 2(b)).

In the next step, recess holes 3a and 3b having inclined surfaces are formed by a laser process in the regions 41 and 42, from which the metal sheet 4 has been removed, such that the recess holes 3a and 3b have a depth extending to the metal sheet 2 on the undersurface side of the insulating substrate 1 (FIG. 2(c)). In Embodiment 1, the first recess hole 3a for mounting an LED chip is formed to have an inner diameter ϕ of 470 μm, and the second recess hole 3b for connecting a fine metal wire is formed to have an inner diameter ϕ of 180 μm.

In the next step, a 20 μm thick Cu plating layer 45 is formed by plating on the surface side of the insulating substrate 1 such that the plating layer 45 extends over the side faces of the recess holes 3a and 3b and the metal sheet 2 at the bottom of the recess holes 3a and 3b (FIG. 2(d)). In this process, a resist is used to protect areas on which the Cu plating is unnecessary.

In the next step, a 10 μm thick Ni/Au layer is formed on the surface of the plating layer 45 by vapor deposition to protect the surface from rust caused by moisture, oxidation, etc.

In the next step, in order to form insulating regions, an unnecessary portion of the Ni/Au layer, Cu plate layer 45 and metal sheet 4 on the surface of the insulating substrate 1 is removed (indicated by reference numeral 46). At the same time, an unnecessary portion of the metal sheet 2 on the undersurface of the insulating substrate 1 is also removed (indicated by reference numeral 22) (FIG. 2(e)). In this manner, a metal sheet 4a serving as a first wiring pattern and a metal sheet 4b serving as a second wiring pattern are formed on the surface of the insulating substrate 1 in an insulated state. Likewise, a metal sheet 2a facing the metal sheet 4a as the first wiring pattern and a metal sheet 2b facing the metal sheet 4b as the second wiring pattern are formed on the undersurface of the insulating substrate 1 in an insulated state.

In the next step, an LED chip 5 is mounted on the metal sheet 4a at the bottom of the recess hole 3a for mounting an LED chip, using a silver paste (FIG. 2(f)).

In the next step, the mounted LED chip 5 and the metal sheet 4b at the bottom of the recess hole 3b for connecting a fine metal wire are electrically connected by bonding using a fine metal wire 6 (FIG. 2(g)).

In the next step, the entire surface of the insulating substrate 1, including the LED chip 5 and the fine metal wire 6, is encapsulated in a transparent resin (FIG. 2(h)). Specifically, the LED chip 5 including the first recess hole 3a and the entire fine metal wire 6 including the second recess hole 3b are encapsulated by a potting process using a silicone-based resin that contains a fluorescent material, forming a first transparent resin 71. Then, the entire surface of the insulating substrate 1, including the first transparent resin 71, is encapsulated by a transfer molding process using an epoxy-based resin that contains no fluorescent material, forming a second transparent resin 72. Here, the conditions for curing the first transparent resin 71 in the potting process and the second transparent resin 72 in the transfer molding process are set at 150° C. for one hour.

The reason for using a silicone resin for the first transparent resin 71 is to suppress to a minimum possible the degradation caused by light directly emitted from the chip before conversion by the fluorescent material into longer wavelength light. Likewise, the reason for using an epoxy resin for the second transparent resin is to stabilize the outer shape with its high rigidity.

Although the wiring patterns (Cu) provided in the insulating substrate are protected by the Ni/Au layer, in order to increase light reflectivity, the surface of the insulating substrate may be plated with Ag so as to at least include the first and second recess holes. In this case, it is preferable that the entire surface of the insulating substrate is covered with the second transparent resin. By using a resin having a gas blocking property and low hygroscopicity, such as an epoxy resin, as the second transparent resin, it is possible to protect the Ag plating from corrosion.

Finally, dicing is performed to obtain a pseudo-white light emitting chip-type LED 10 (see FIG. 1) having a width of 1.6 mm, a thickness of 0.8 mm and a height of 0.2 mm.

In the present embodiment, a yellow fluorescent material is added to the first transparent resin 71, but it is also possible to add a red fluorescent material or green fluorescent material instead of a yellow fluorescent material. When a red or green fluorescent material is added, high color-rendering white light whose color rendering property is improved as compared to pseudo-white light can be emitted. This applies to the embodiments given hereunder.

(Variation 1 of Embodiment 1)

Figure 3:
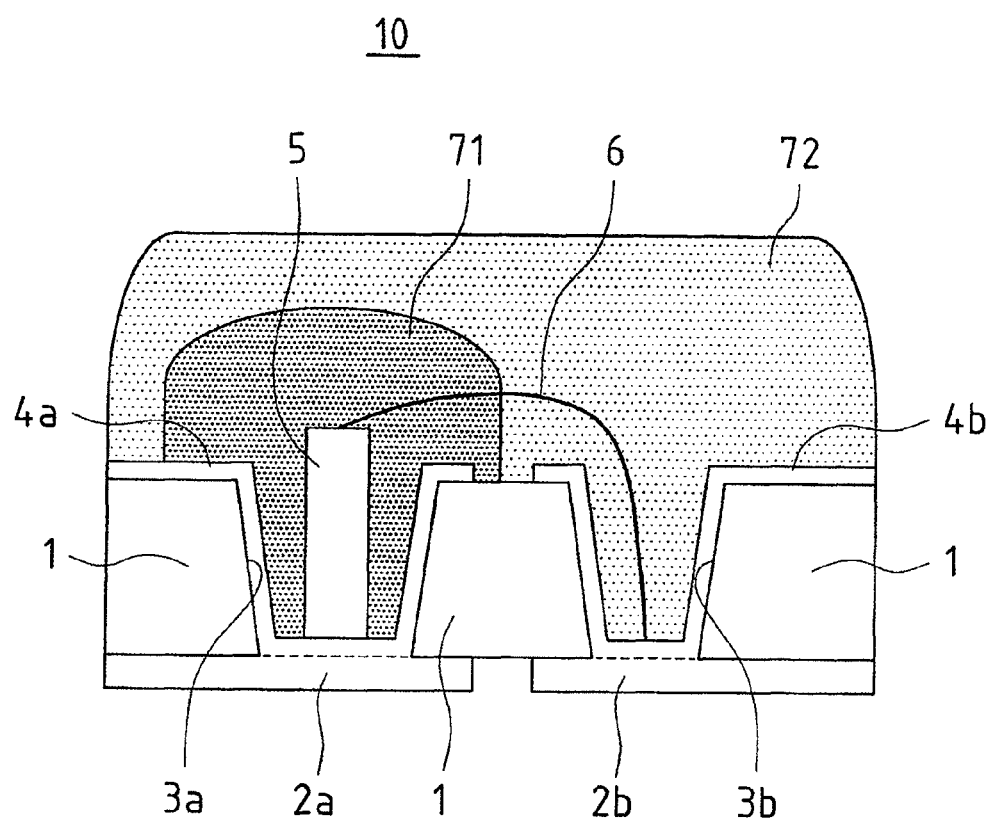
FIG. 3 is a cross-sectional view of a chip-type LED according to Variation 1 of Embodiment 1 of the present invention.

FIG. 3 is a cross-sectional view showing the structure of a chip-type LED 10 according to Variation 1 of Embodiment 1.

Variation 1 employs a structure in which the first transparent resin 71 is formed to include only the entire first recess hole 3a, including the LED chip 5 and part of the fine metal wire 6 connected to the LED chip 5, and the periphery of the hole, and not to include the second recess hole 3b. The first transparent resin 71 is formed using a silicone-based resin containing a yellow fluorescent material, and the second transparent resin 72 is formed using an epoxy-based resin containing no fluorescent material. Other elements are the same as those of the chip-type LED 10 of Embodiment 1 shown in FIG. 1, and thus a description thereof is omitted here. Similarly, a manufacturing method thereof is the same as the manufacturing method described with reference to FIGS. 2(a) to 2(h), and thus a description thereof is omitted here.

(Variation 2 of Embodiment 1)

Figure 4:
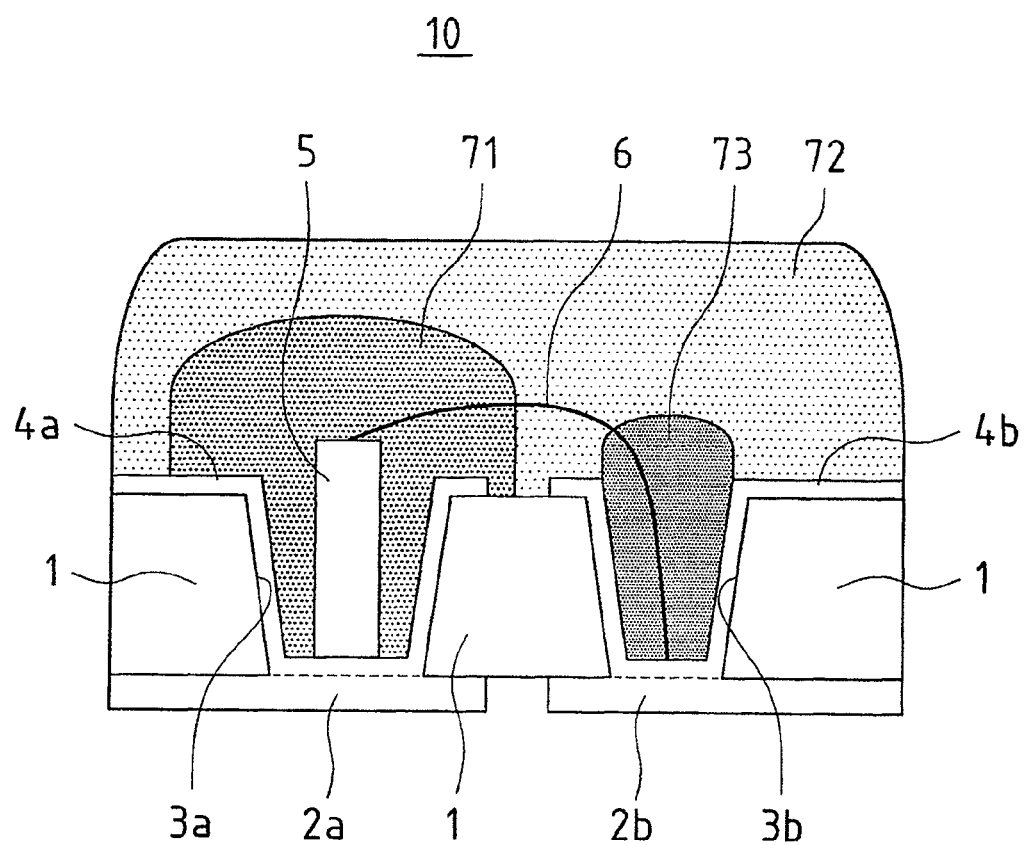
FIG. 4 is a cross-sectional view of a chip-type LED according to Variation 2 of Embodiment 1 of the present invention.

FIG. 4 is a cross-sectional view showing the structure of a chip-type LED 10 according to Variation 2 of Embodiment 1.

Variation 2 employs a structure in which the LED chip 5 including the first recess hole 3a and part of the fine metal wire 6 are encapsulated in the first transparent resin 71 containing a yellow fluorescent material, the second recess hole 3b and another part of the fine metal wire 6 are encapsulated in a third transparent resin 73, and the entire surface of the insulating substrate 1, including the first transparent resin 71 and the third transparent resin 73, is encapsulated in the second transparent resin 72. In Variation 2, the first transparent resin 71 is made of a silicone-based resin, the second transparent resin 72 is made of an epoxy-based resin, and the third transparent resin 73 is made of a silicone-based resin. By forming the third transparent resin 73 with a silicone-based resin, it is possible to reduce the occurrence of a disconnection defect in the connecting portion of the fine metal wire 6 because silicone-based resins have a small thermal expansion coefficient. Furthermore, in Variation 2, because different encapsulating resins can be used for the first recess hole 3a for mounting an LED chip, the second recess hole 3b for connecting a fine metal wire and other regions of the insulating substrate surface, it is possible to form a package structure that can provide a great freedom in selection of resins.

In Variation 2, the step of encapsulating the entire surface of the insulating substrate 1, including the LED chip 5 and the fine metal wire 6, in transparent resins is different from that of the manufacturing method described above with reference to FIGS. 2(a) to 2(h). Accordingly, only different steps will be described here.

Specifically, the LED chip 5 including the first recess hole 3a and part of the fine metal wire 6 are encapsulated by a potting process using a silicone-based resin that contains a fluorescent material, forming a first transparent resin 71. Then, the second recess hole 3b and another part of the fine metal wire 6 are encapsulated by a potting process using a silicone-based resin, forming a third transparent resin 73. After that, the entire surface of the insulating substrate 1, including the first transparent resin 71 and the third transparent resin 73, is encapsulated by a transfer molding process using an epoxy-based resin to form a second transparent resin 72. Here, the conditions for curing the first transparent resin 71 and the third transparent resin 73 in the potting process and the second transparent resin 72 in the transfer molding process are set at 150° C. for one hour.

(Variation 3 of Embodiment 1)

Figure 5:
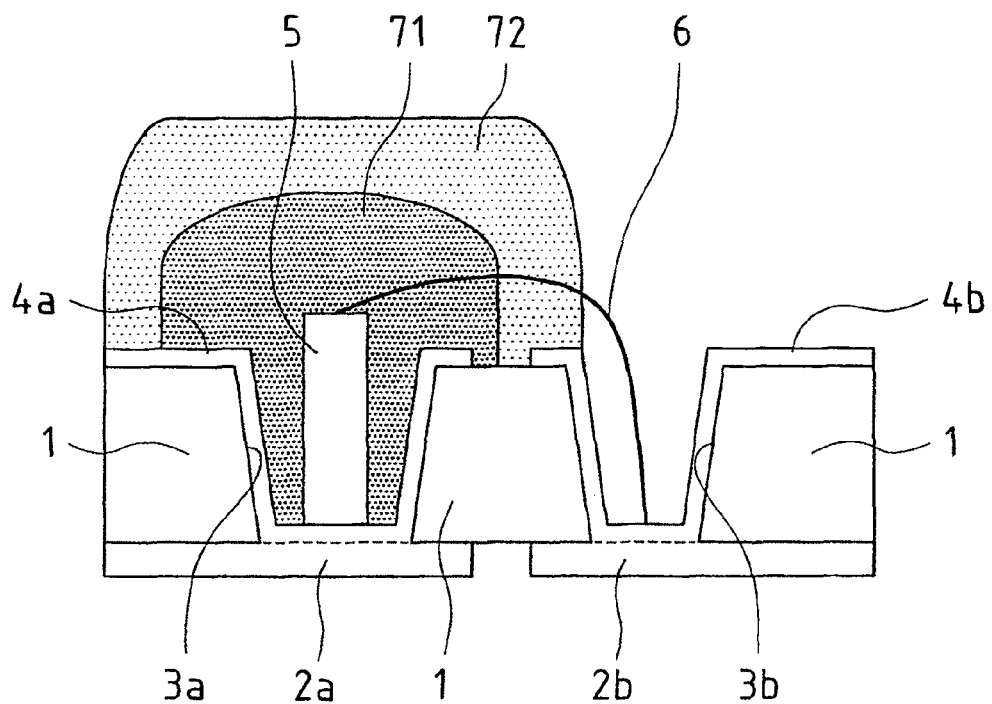
FIG. 5 is a cross-sectional view of a chip-type LED according to Variation 3 of Embodiment 1 of the present invention.

FIG. 5 is a cross-sectional view showing the structure of a chip-type LED 10 according to Variation 3 of Embodiment 1.

Variation 3 employs a structure in which the second transparent resin 72 is formed to include the entire first transparent resin 71, the entire first recess hole 3a and the periphery of the hole, and not to include the second recess hole 3b. Other elements are the same as those of the chip-type LED 10 according to Variation 1 of Embodiment 1 shown in FIG. 3, and thus a description thereof is omitted here. Similarly, a manufacturing method thereof is the same as the manufacturing method described with reference to FIGS. 2(a) to 2(h), and thus a description thereof is omitted here.

<Embodiment 2>

Figure 6:
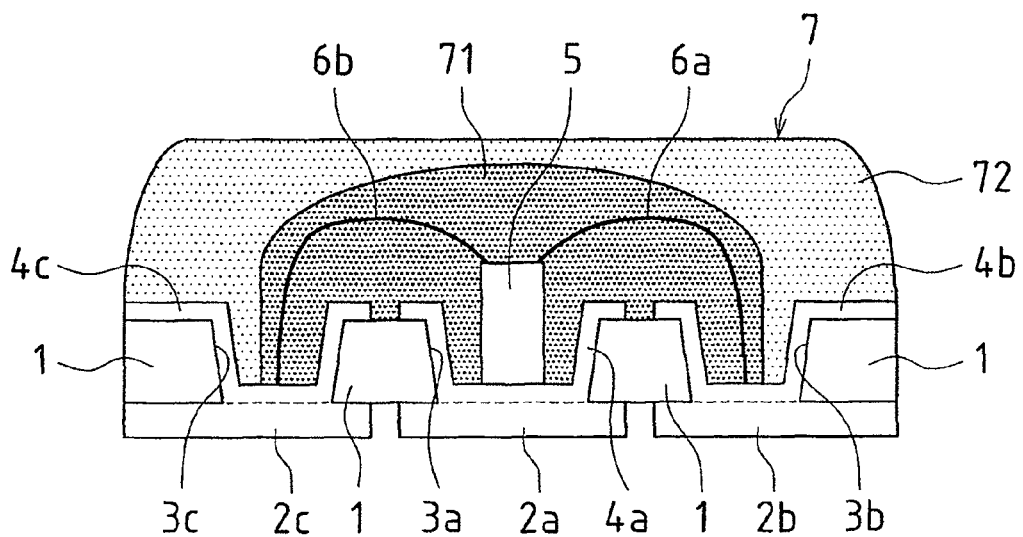
FIG. 6 is a cross-sectional view of a chip-type LED according to Embodiment 2 of the present invention.

FIG. 6 is a cross-sectional view showing the structure of a chip-type LED 20 according to Embodiment 2. In the description given below, the same reference numerals are assigned to components that are the same (or have the same functions) as those of Embodiment 1 described above.

In the chip-type LED 20, a first recess hole (through hole) 3a for mounting an LED chip is formed in an insulating substrate 1. A second recess hole (through hole) 3b and a third recess hole (through hole) 3c both for connecting a fine metal wire are formed on opposite sides of the first recess hole 3a so as to sandwich the first recess hole 3a. Metal (Cu) sheets 2a, 2b and 2c serving as the wiring patterns for the recess holes are formed on the undersurface of the insulating substrate 1 in an electrically insulated state. On the surface side of the insulating substrate 1, a metal sheet 4a serving as a first wiring pattern is formed in a portion that includes the first recess hole 3a, a metal sheet 4b serving as a second wiring pattern is formed in a portion that includes the second recess hole 3b, and a metal sheet 4c serving as a third wiring pattern is formed in a portion that includes the third recess hole 3c. In this wiring structure, an LED chip 5 is mounted on the metal sheet 4a at the bottom portion of the first recess hole 3a. The LED chip 5 is electrically connected to the metal sheet 4b at the bottom portion of the second recess hole 3b via a fine metal wire 6a and also to the metal sheet 4c at the bottom portion of the third recess hole 3c via a fine metal wire 6b. In this state, the entire surface of the insulating substrate 1, including the LED chip 5 and the fine metal wires 6a and 6b, is encapsulated in a transparent resin 7.

In Embodiment 2, the transparent resin 7 is formed of a first transparent resin 71 for encapsulating the LED chip 5 including the first recess hole 3a, the fine metal wire 6a including the second recess hole 3b and the fine metal wire 6b including the third recess hole 3c; and a second transparent resin 72 for encapsulating the entire surface of the insulating substrate 1 including the first transparent resin 71. In Embodiment 2, the first transparent resin 71 is made of a silicone-based resin that contains a yellow fluorescent material, and the second transparent resin 72 is made of an epoxy-based resin that contains no fluorescent material. The insulating substrate 1 is formed of a glass epoxy resin and has a thickness of approximately 60 μm. The metal (Cu) sheets 2a and 2b formed on the undersurface side are formed to have a thickness of approximately 25 μm. Furthermore, in Embodiment 2, the first recess hole 3a for mounting an LED chip is formed to have an inner diameter φ of 500 μm, and the second recess hole 3b and third recess hole 3c for connecting a fine metal wire are formed to have an inner diameter φ of 200 μm.

As described above, according to Embodiment 2, because the area on which the LED chip 5 is mounted and the areas to which ends of the fine metal wires 6a and 6b, the other ends of which are connected to the LED chip 5, are connected are formed on the metal sheets 2a, 2b and 2c, the height at which the fine metal wires 6a and 6b are disposed can be lowered. In addition, because the LED chip 5 is mounted directly on the metal sheets 4a and 2a, it is unnecessary to use a conventional substrate, so the thickness can be reduced and the height of the fine metal wires 6a and 6b can be made lower than that of conventional technology, making the chip-type LED even thinner.

A method for manufacturing the chip-type LED 20 thus configured will be described with reference to FIGS. 7(a) to 7(h).

Figure 7:
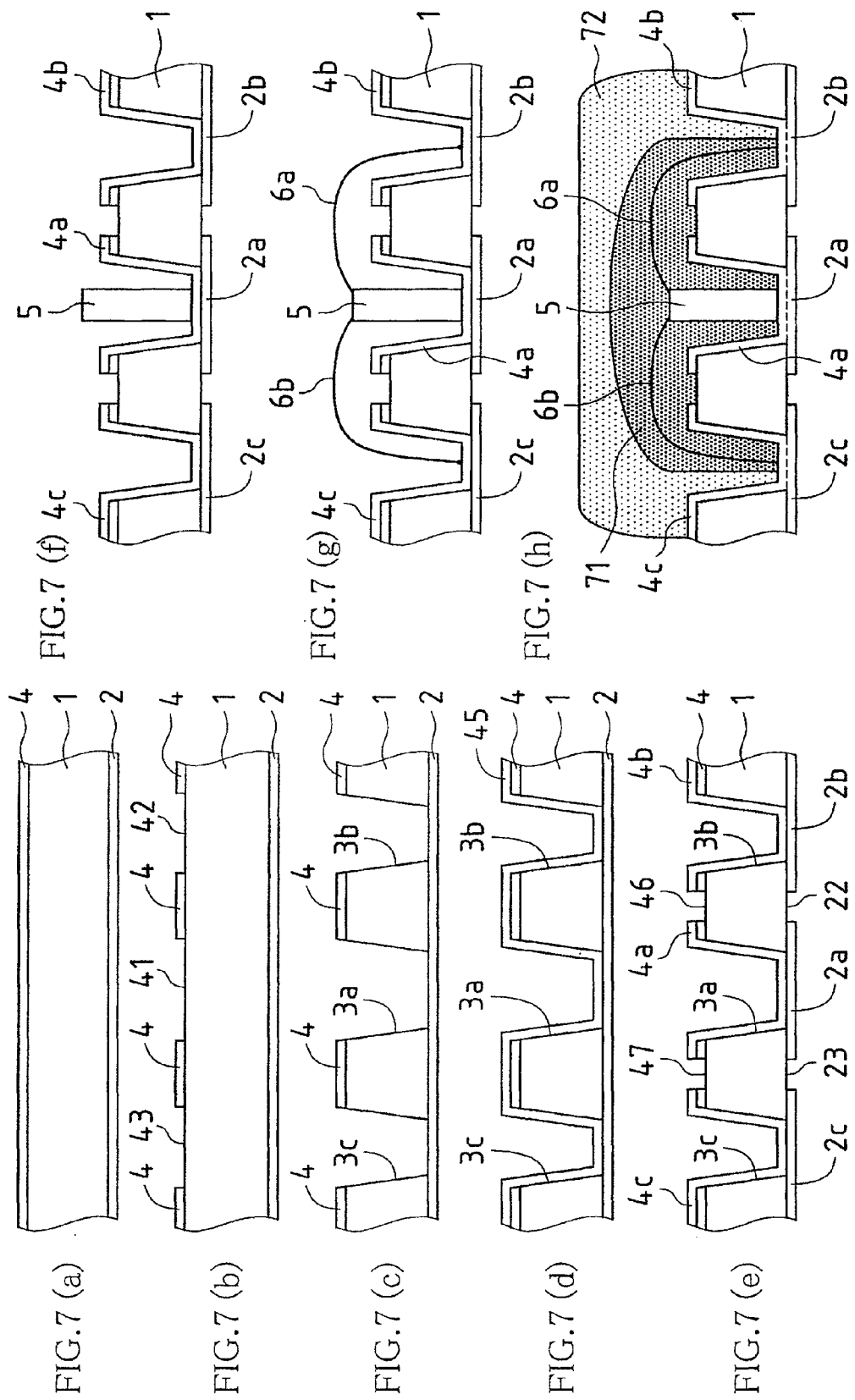
FIG. 7(*a*) is a diagram illustrating a method for manufacturing the chip-type LED according to Embodiment 2 of the present invention.

In the first step, metal sheets 2 and 4 are formed on the surface and undersurface of an insulating substrate 1, respectively (FIG. 7(a)).

In the next step, the metal sheet 4 is removed at an LED chip mounting position 41 and fine metal wire connecting positions 42 and 43 on the surface side of the insulating substrate 1 (FIG. 7(b)).

In the next step, recess holes 3a, 3b and 3c having inclined surfaces are formed by a laser process in the regions 41, 42 and 43, from which the metal sheet 4 has been removed, such that the recess holes 3a, 3b and 3c have a depth extending to the metal sheet 2 on the undersurface side of the insulating substrate 1 (FIG. 7(c)). In Embodiment 2, the first recess hole 3a for mounting an LED chip is formed to have an inner diameter φ of 500 μm and the second recess hole 3b and third recess hole 3c for connecting a fine metal wire are formed to have an inner diameter φ of 200 μm.

In the next step, a 15 μm thick Cu plating layer 45 is formed by plating on the surface side of the insulating substrate 1 such that the plating layer 45 extends over the side faces of the recess holes 3a, 3b and 3c and the metal sheet 2 at the bottom of the recess holes 3a, 3b and 3c (FIG. 7(d)). In this process, a resist is used to protect areas on which the Cu plating is unnecessary.

In the next step, a 15 μm thick Ni/Au layer is formed on the surface of the plating layer 45 by vapor deposition.

In the next step, in order to form insulating regions, unnecessary portions of the Ni/Au layer, Cu plating layer 45 and metal sheet 4 on the surface of the insulating substrate 1 are removed (indicated by reference numerals 46 and 47). At the same time, unnecessary portions of the metal sheet 2 on the undersurface of the insulating substrate 1 are also removed (indicated by reference numerals 22 and 23) (FIG. 7(e)). In this manner, a metal sheet 4a serving as a first wiring pattern, a metal sheet 4b serving as a second wiring pattern and a metal sheet 4c serving as a third wiring pattern are formed on the surface of the insulating substrate 1 in an insulated state. Likewise, a metal sheet 2a facing the metal sheet 4a as the first wiring pattern, a metal sheet 2b facing the metal sheet 4b as the second wiring pattern and a metal sheet 2c facing the metal sheet 4c as the third wiring pattern are formed on the undersurface of the insulating substrate 1 in an insulated state.

In the next step, an LED chip 5 is mounted on the metal sheet 4a at the bottom of the recess hole 3a for mounting an LED chip, using a silicone resin (FIG. 7(f)).

In the next step, the mounted LED chip 5 and the metal sheet 4b at the bottom of the recess hole 3b for connecting a fine metal wire are electrically connected by bonding using a fine metal wire 6a. At the same time, the mounted LED chip 5 and the metal sheet 4c at the bottom of the recess hole 3c for connecting a fine metal wire are electrically connected by bonding using a fine metal wire 6b (FIG. 7(g)).

In the next step, the entire surface of the insulating substrate 1, including the LED chip 5 and the fine metal wires 6a and 6b, is encapsulated in a transparent resin (FIG. 7(h)). Specifically, the LED chip 5 including the first recess hole 3a and the entire fine metal wires 6a and 6b including the second recess hole 3b and the third recess hole 3c are encapsulated by a potting process using a silicone-based resin that contains a fluorescent material, forming a first transparent resin 71. Then, the entire surface of the insulating substrate 1 including the first transparent resin 71 is encapsulated by a transfer molding process using an epoxy-based resin that contains no fluorescent material, forming a second transparent resin 72. Here, the conditions for curing the first transparent resin 71 in the potting process are set at 150° C. for three hours, and the conditions for curing the second transparent resin 72 in the transfer molding process are set at 120° C. for one hour.

Finally, dicing is performed to obtain a blue light emitting chip-type LED 20 having a width of 1.5 mm, a thickness of 0.8 mm and a height of 0.18 mm (see FIGS. 7(a) to 7(h)).

<Embodiment 3>

Figure 8:
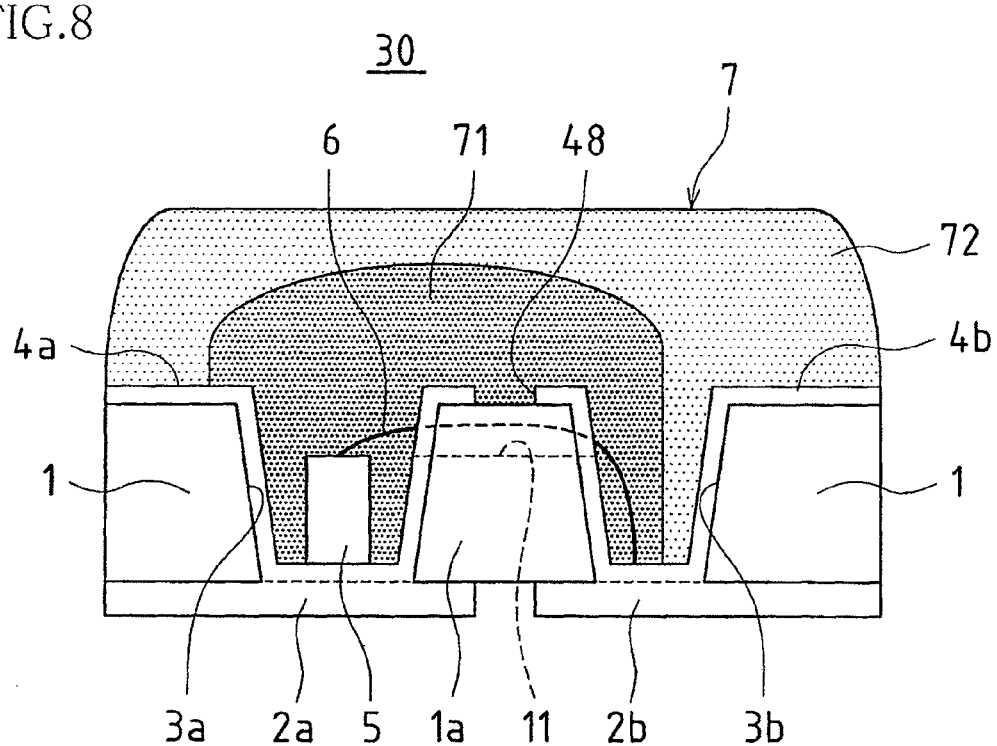
FIG. 8 is a cross-sectional view of a chip-type LED according to Embodiment 3 of the present invention.
Figure 9:
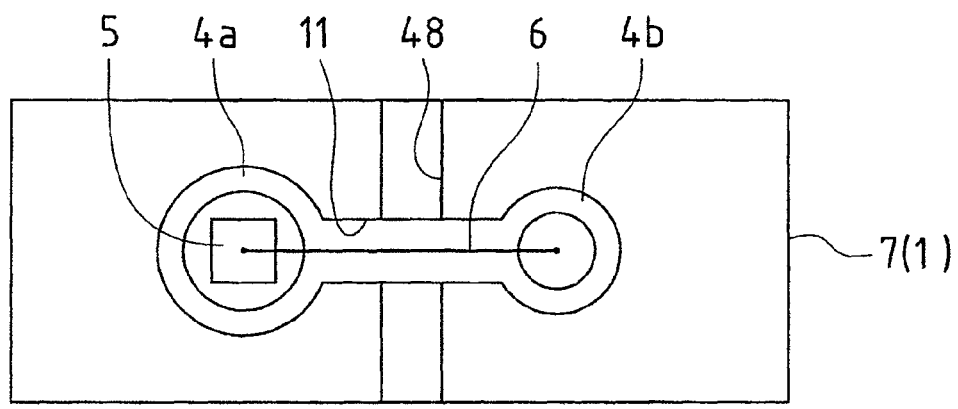
FIG. 9 is a plan view of the chip-type LED according to Embodiment 3 of the present invention.

FIGS. 8 and 9 are a cross-sectional view and a plan view of a chip-type LED 30 according to Embodiment 3. In the description given below, the same reference numerals are assigned to components that are the same (or have the same functions) as those of Embodiment 1 described above.

In the chip-type LED 30, a first recess hole (through hole) 3a for mounting an LED chip and a second recess hole (through hole) 3b for connecting a fine metal wire are formed in an insulating substrate 1. Metal (Cu) sheets 2a and 2b serving as the wiring patterns for the recess holes are formed on the undersurface side of the insulating substrate 1 in an electrically insulated state. On the surface side of the insulating substrate 1, a metal sheet 4a serving as a first wiring pattern is formed in a portion that includes the first recess hole 3a, and a metal sheet 4b serving as a second wiring pattern is formed in a portion that includes the second recess hole 3b. The metal sheets 4a and 4b are insulated from each other by a cut-off portion 48 that has a predetermined width and is formed in the center portion of the surface of a partition wall 1*a* for separating the first recess hole 3*a* and the second recess hole 3*b* from each other, by removing the metal sheet 4. A recess groove 11 having a predetermined depth is formed on the surface of the partition wall 1*a* in a direction perpendicular to the cut-off portion 48, or in other words, such that the recess groove 11 connects the first recess hole 3*a* and the second recess hole 3*b*.

In this wiring structure, an LED chip 5 is mounted on the metal sheet 4*a* at the bottom portion of the first recess hole 3*a*, and the LED chip 5 is electrically connected to the metal sheet 4*b* at the bottom portion of the second recess hole 3*b* via a fine metal wire 6. The fine metal wire 6 is provided such that it passes through the inside of the recess groove 11 of the partition wall 1*a*. In other words, the fine metal wire 6 is provided such that it does not appear above the surface of the insulating substrate 1. In this state, the entire surface of the insulating substrate 1, including the LED chip 5 and the fine metal wire 6, is encapsulated in a transparent resin 7.

In Embodiment 3, the transparent resin 7 is formed of a first transparent resin 71 for encapsulating the LED chip 5 including the first recess hole 3*a* and the entire fine metal wire 6 including the second recess hole 3*b*; and a second transparent resin 72 for encapsulating the entire surface of the insulating substrate 1 including the first transparent resin 71. In Embodiment 3, the first transparent resin 71 is made of a silicone-based transparent resin that contains a fluorescent material (e.g., $CaAlSiN_3$:Eu, $Ca_3(Sc.Mg)_2Si_3O_{12}$:Ce, etc.). The second transparent resin 72 is formed of an epoxy-based transparent resin that contains no fluorescent material.

In Embodiment 3, the insulating substrate 1 is formed of a glass epoxy resin and has a thickness of approximately 55 µm. The metal (Cu) sheets 2*a* and 2*b* formed on the undersurface side are formed to have a thickness of approximately 18 µm. In Embodiment 3, the first recess hole 3*a* for mounting an LED chip is formed to have an inner diameter $\phi$ of 400 µm, and the second recess hole 3*b* for connecting a fine metal wire is formed to have an inner diameter $\phi$ of 150 µm. The recess groove 11 is formed to have a depth of 25 µm.

As described above, according to Embodiment 3, because the area on which the LED chip 5 is mounted and the area to which an end of the fine metal wire 6, the other end of which is connected to the LED chip 5, is connected are formed on the metal sheets 2*a* and 2*b*, and the fine metal wire 6 is passed through the inside of the recess groove 11, it is possible to lower the height of the fine metal wire 6 even more than with Embodiments 1 and 2. In addition, because the LED chip 5 is mounted directly on the metal sheets 4*a* and 2*a*, it is unnecessary to use a conventional substrate, so the thickness can be reduced.

A method for manufacturing the chip-type LED 30 thus configured will be described with reference to FIGS. 10(*a*) to 10(*h*).

Figure 10:
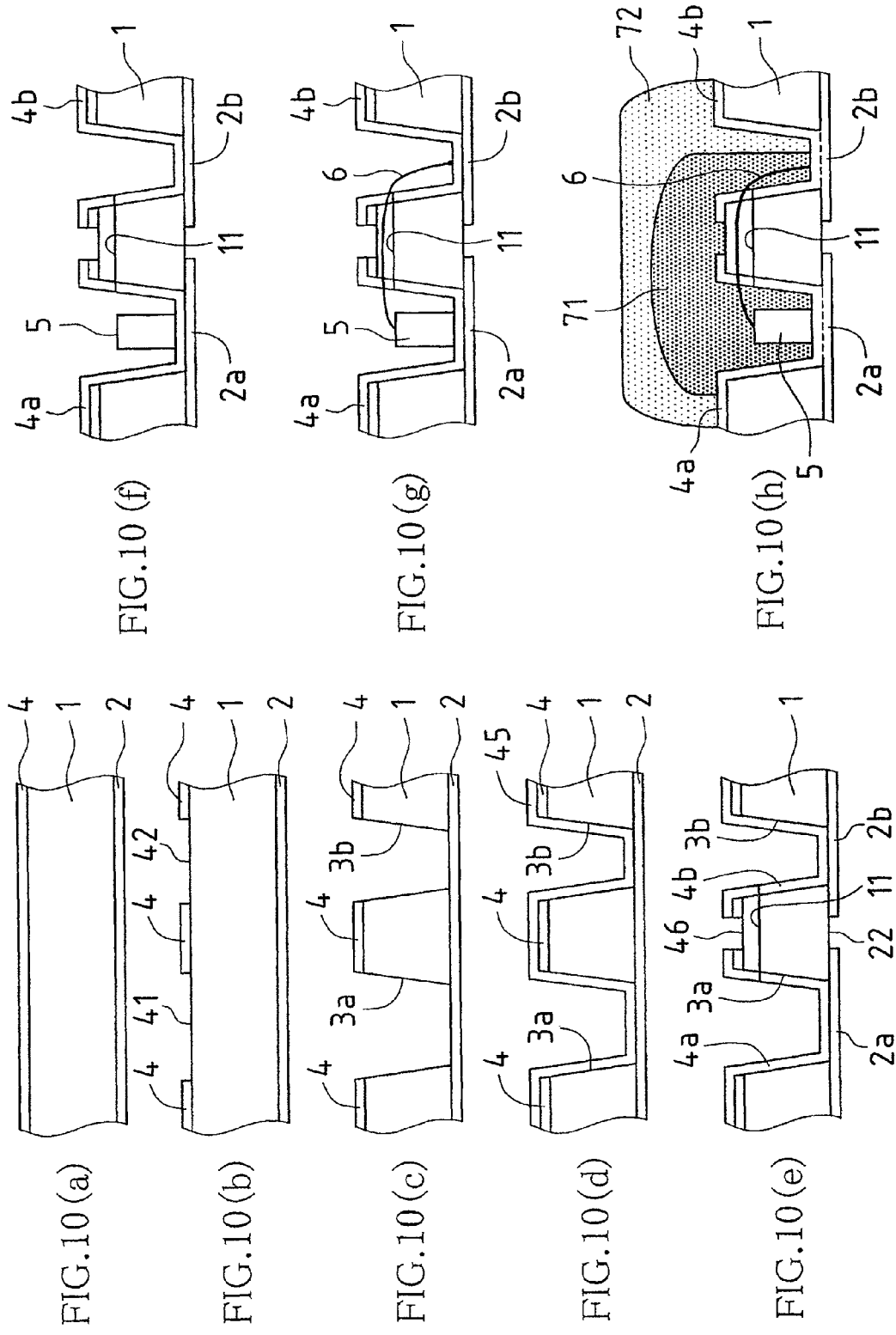
FIG. 10(*a*) is a diagram illustrating a method for manufacturing the chip-type LED according to Embodiment 3 of the present invention.

In the first step, metal sheets 2 and 4 are formed on the surface and undersurface of an insulating substrate 1, respectively (FIG. 10(*a*)).

In the next step, the metal sheet 4 is removed at an LED chip mounting position 41, a fine metal wire connecting position 42 and a wiring position (the position at which a recess groove 11 is formed) for a fine metal wire 6 on the surface side of the insulating substrate 1 (FIG. 10(*b*)).

In the next step, recess holes 3*a* and 3*b* having inclined surfaces are formed by a laser process in the regions 41 and 42, from which the metal sheet 4 has been removed, such that the recess holes 3*a* and 3*b* have a depth extending to the metal sheet 2 on the undersurface side of the insulating substrate 1. At this time, a recess groove 11 having a predetermined depth is formed also by the same laser process on the surface of the partition wall 1*a* for separating recess holes 3*a* and 3*b* to be formed such that the recess groove 11 connects the recess holes 3*a* and 3*b* (FIG. 10(*c*),FIG. 8, FIG. 9). In Embodiment 3, the first recess hole 3*a* for mounting an LED chip is formed to have an inner diameter $\phi$ of 500 µm, the second recess hole 3*b* for connecting a fine metal wire is formed to have an inner diameter $\phi$ of 200 µm, and the recess groove 11 is formed to have a depth of 25 µm.

In the next step, a 25 µm thick Cu plating layer 45 is formed by plating on the surface side of the insulating substrate 1 such that the plating layer 45 extends over the side faces of the recess holes 3*a* and 3*b* and the metal sheet 2 at the bottom of the recess holes 3*a* and 3*b* (FIG. 10(*d*)). In this process, a resist is used to protect areas on which the Cu plating is unnecessary.

In the next step, a 10 µm thick Ni/Au layer is formed on the surface of the plating layer 45 by vapor deposition.

In the next step, in order to form insulating regions, an unnecessary portion of the Ni/Au layer, Cu plate layer 45 and metal sheet 4 on the surface of the insulating substrate 1 is removed (indicated by reference numeral 46). At the same time, an unnecessary portion of the metal sheet 2 on the undersurface of the insulating substrate 1 is also removed (indicated by reference numeral 22) (FIG. 10(*e*)). In this manner, a metal sheet 4*a* serving as a first wiring pattern and a metal sheet 4*b* serving as a second wiring pattern are formed on the surface of the insulating substrate 1 in an insulated state. Likewise, a metal sheet 2*a* facing the metal sheet 4*a* as the first wiring pattern and a metal sheet 2*b* facing the metal sheet 4*b* as the second wiring pattern are formed on the undersurface of the insulating substrate 1 in an insulated state. In this step of Embodiment 3, the Ni/Au layer and Cu plating layer 45 are removed at the surface of the recess groove 11 in which a fine metal wire 6 is to be provided. That is, the insulating substrate 1 is exposed at the surface of the recess groove 11.

In the next step, an LED chip 5 is mounted on the metal sheet 4*a* at the bottom of the recess hole 3*a* for mounting an LED chip using an epoxy resin (FIG. 10(*f*)).

In the next step, the mounted LED chip 5 and the metal sheet 4*b* at the bottom of the recess hole 3*b* for connecting a fine metal wire are electrically connected by bonding using a fine metal wire 6 (FIG. 10(*g*)).

In the next step, the entire surface of the insulating substrate 1, including the LED chip 5 and the fine metal wire 6, is encapsulated in a transparent resin (FIG. 10(*h*)). Specifically, the LED chip 5 including the first recess hole 3*a*, the fine metal wire 6 including the second recess hole 3*b* and the recess groove 11 for communicating the recess holes 3*a* and 3*b* are all encapsulated by a potting process using a silicone-based resin that contains a fluorescent material ($CaAlSiN_3$:Eu, $Ca_3(Sc.Mg)_2Si_3O_{12}$:Ce), forming a first transparent resin 71. Then, the entire surface of the insulating substrate 1 including the first transparent resin 71 is encapsulated by a transfer molding process using an epoxy-based resin that contains no fluorescent material, forming a second transparent resin 72. Here, the conditions for curing the first transparent resin 71 in the potting process are set at 150° C. for one hour, and the conditions for curing the second transparent resin 72 in the transfer molding process is set at 150° C. for three hours.

Finally, dicing is performed to obtain a high color-rendering chip-type LED 30 (see FIG. 8) having a width of 1.65 mm, a thickness of 0.75 mm and a height of 0.15 mm.

According to Embodiment 3, because the fine metal wire 6 can be passed through the inside of the recess groove 11 formed between the recess hole 3*a* for mounting an LED chip and the recess hole 3b for connecting a fine metal wire, it is possible to produce a chip-type LED 30 having an even lower height of 0.15 mm.

(Variation 1 of Embodiment 3)

Figure 11:
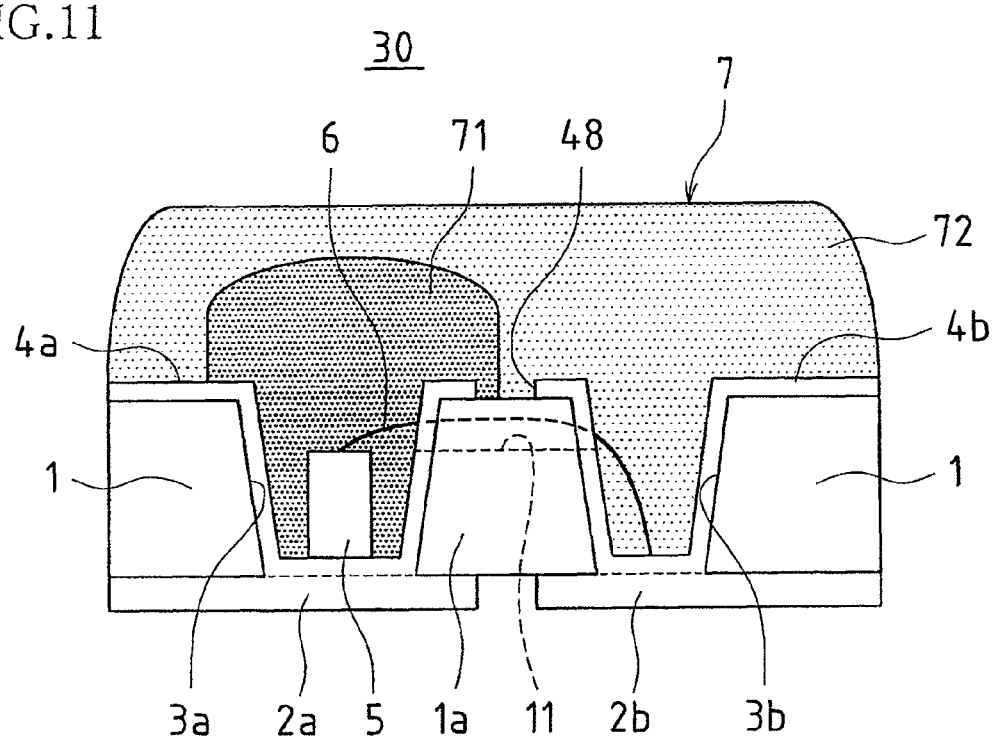
FIG. 11 is a cross-sectional view showing the structure of a chip-type LED according to Variation 1 of Embodiment 3 of the present invention.
Figure 12:
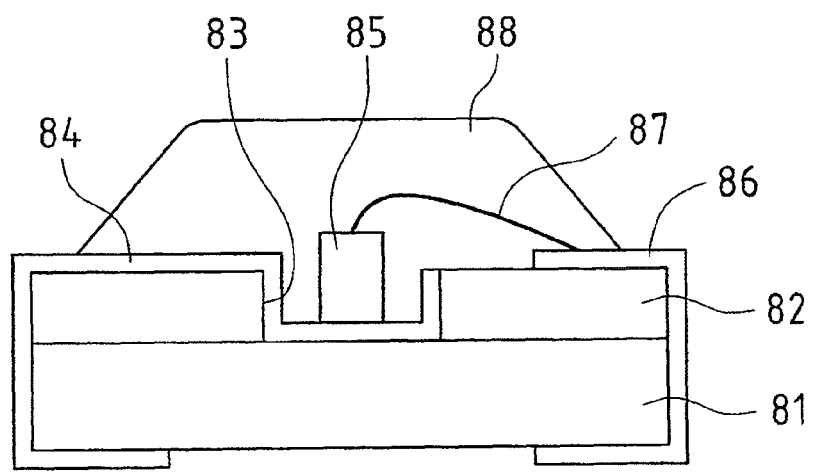
FIG. 12 is a cross-sectional view showing an example of the structure of a conventional chip-type LED.

FIG. 11 is a cross-sectional view showing the structure of a chip-type LED 30 according to Variation 1 of Embodiment 3.

Variation 1 of Embodiment 3 employs a structure in which the first transparent resin 71 is formed to include only the entire first recess hole 3a, including the LED chip 5 and part of the fine metal wire 6 connected to the LED chip 5, and the periphery of the hole, and not to include the second recess hole 3b. Other elements are the same as those of the chip-type LED 10 of Embodiment 3 shown in FIG. 8, and thus a description thereof is omitted here. Similarly, a manufacturing method thereof is the same as the manufacturing method of Embodiment 3 described with reference to FIGS. 10(a) to 10(h), and thus a description thereof is omitted here.

Embodiments 1 to 3 given above are discussed in the context of a single-chip LED lamp that includes a pair of patterns on an insulating substrate, but it is also possible to configure a multicolor light emitting LED lamp (having a plurality of LED chips) easily by forming a plurality of patterns using the same procedure and connecting a plurality of LED chips. As the LED chip 5, it is possible to use, in addition to a blue light emitting LED chip, LED chips such as red, yellow and green LED chips can be used.

In the present application, the invention that emits white light has been described, but by selecting an LED chip that emits light having a wavelength within the range from ultraviolet to blue light and choosing a fluorescent material capable of emitting light of a desired color within the range from blue to red visible light under excitation by the LED chip, it is possible to provide a chip-type LED capable of emitting a desired visible light. For example, if a blue light emitting LED chip and a red fluorescent material, namely $CaAlSiN_3$:Eu, are selected, a monochromatic light source capable of emitting red light is obtained.

The present invention may be embodied in various other forms without departing from the gist or essential characteristics thereof. The embodiments disclosed in this application are to be considered in all respects as illustrative and not limiting. The scope of the invention is indicated by the appended claims rather than by the foregoing description, and all modifications or changes that come within the meaning and range of equivalency of the claims are intended to be embraced therein.

What is claimed is:

1. A method for manufacturing a chip-type LED comprising:
    a step of forming metal sheets on the surface and the undersurface of an insulating substrate;
    a step of removing the metal sheet on the surface side of the insulating substrate at an LED chip mounting position and a fine metal wire connecting position;
    a step of forming a first recess hole and a second recess hole in the regions from which the metal sheet has been removed such that the first and second recess holes have a depth extending to the metal sheet on the undersurface side of the insulating substrate;
    a step of forming a conductive layer such that a conductive layer extends over the side faces of the recess holes and the metal sheet at the bottom of the recess holes;
    a step of forming an Au-containing layer on the surface of the conductive layer by vapor deposition;
    a step of forming an insulating region;
    a step of mounting an LED chip on the bottom of the first recess hole;
    a step of electrically connecting the LED chip and the bottom of the second recess hole using a fine metal wire;
    a first encapsulating step of encapsulating the first recess hole and part of the fine metal wire in a first transparent resin by a potting process so as to cover the LED chip; and
    a second encapsulating step of encapsulating the first transparent resin in a second transparent resin by a transfer molding process so as to cover the first transparent resin.

2. The method for manufacturing a chip-type LED according to claim 1, wherein the first encapsulating step involves further encapsulating the second recess hole and the entire fine metal wire in the first transparent resin.

3. The method for manufacturing a chip-type LED according to claim 1, wherein the second encapsulating step involves encapsulating the second recess hole and part of the fine metal wire.

4. The method for manufacturing a chip-type LED according to claim 1, further comprising a third encapsulating step of encapsulating the second recess hole and part of the fine metal wire in a third transparent resin so as to cover the second recess hole,
    wherein, in the second encapsulating step, the first transparent resin and the third transparent resin are covered with the second transparent resin.

5. The method for manufacturing a chip-type LED according to claim 1, wherein, in the second encapsulating step, the surface of the insulating substrate is covered with the second transparent resin.

6. The method for manufacturing a chip-type LED according to claim 1, wherein, in the second encapsulating step, the second recess hole is not covered with the second transparent resin.

* * * * *